(12) United States Patent
Gao et al.

(10) Patent No.: US 9,392,700 B2
(45) Date of Patent: *Jul. 12, 2016

(54) TRANSPARENT CONDUCTIVE FILM AND PREPARATION METHOD THEREOF

(71) Applicant: NANCHANG O-FILM TECH. CO., LTD., Nanchang (CN)

(72) Inventors: Yulong Gao, Nanchang (CN); Sheng Zhang, Nanchang (CN); Shengbo Guo, Nanchang (CN); Chunming Chen, Nanchang (CN)

(73) Assignee: Nanchang O-Film Tech. Co., Ltd., Nanchang, Jiangxi (CN)

( * ) Notice: Subject to any disclaimer, the term of this patent is extended or adjusted under 35 U.S.C. 154(b) by 81 days.

This patent is subject to a terminal disclaimer.

(21) Appl. No.: 14/000,112
(22) PCT Filed: Jul. 6, 2013
(86) PCT No.: PCT/CN2013/078943
§ 371 (c)(1),
(2) Date: Aug. 16, 2013
(87) PCT Pub. No.: WO2014/153898
PCT Pub. Date: Oct. 2, 2014

(65) Prior Publication Data
US 2014/0290995 A1    Oct. 2, 2014

(51) Int. Cl.
*H05K 1/00*    (2006.01)
*H05K 3/10*    (2006.01)
(Continued)

(52) U.S. Cl.
CPC ............... *H05K 3/107* (2013.01); *G06F 3/041* (2013.01); *H05K 1/036* (2013.01); *H05K 1/09* (2013.01); *H05K 3/0014* (2013.01); *H05K 3/125* (2013.01);
(Continued)

(58) Field of Classification Search
USPC .......................................... 174/258, 250, 259
See application file for complete search history.

(56) References Cited

U.S. PATENT DOCUMENTS

2009/0219257 A1    9/2009    Frey et al.
2013/0140061 A1    6/2013    Lim et al.
(Continued)

FOREIGN PATENT DOCUMENTS

CN    102222538 A    10/2011
CN    102236485 A    11/2011
(Continued)

OTHER PUBLICATIONS

International Search Report, International application No. PCT/CN2013/078943. Date of mailing: Jan. 2, 2014. SIPO, Beijing, China.

*Primary Examiner* — Andargie M Aychillhum
(74) *Attorney, Agent, or Firm* — Coats & Bennett, P.L.L.C.

(57) ABSTRACT

A transparent conductive film includes a transparent substrate and a polymer layer formed on the transparent substrate, a surface of the polymer layer is patterned to define a meshed trench, the meshed trench is filled with a conductive material to form a sending area, a periphery of the sensing area is printed with a lead, the lead is electrically connected to the conductive material in the meshed trench. Besides, a method of manufacturing the transparent conductive film is provided. In the transparent conductive film and the method, the trench is filled with a conductive material to form a sending area, and the lead is formed by printing and electrically connected to the conductive material, the yield of the lead of the transparent conductive film is relatively high.

10 Claims, 12 Drawing Sheets

US 9,392,700 B2
Page 2

(51) Int. Cl.
*G06F 3/041* (2006.01)
*H05K 3/12* (2006.01)
*H05K 1/03* (2006.01)
*H05K 1/09* (2006.01)
*H05K 3/00* (2006.01)

(52) U.S. Cl.
CPC ...... *H05K 3/1216* (2013.01); *H05K 2201/0108* (2013.01); *H05K 2201/09681* (2013.01); *H05K 2203/0108* (2013.01); *Y10T 29/49155* (2015.01)

(56) References Cited

U.S. PATENT DOCUMENTS

2014/0070349 A1* 3/2014 Oganesian .................... 257/432

2014/0198264 A1 7/2014 Gao et al.

FOREIGN PATENT DOCUMENTS

| | | |
|---|---|---|
| CN | 102707849 A | 10/2012 |
| CN | 102722279 A | 10/2012 |
| CN | 102903423 A | 1/2013 |
| CN | 102930922 A | 2/2013 |
| CN | 103165226 A | 6/2013 |
| CN | 203179571 U | 9/2013 |
| EP | 2544080 A2 | 1/2013 |
| EP | 2685463 A1 | 1/2014 |
| JP | 2011513846 A | 4/2011 |
| JP | 2012108844 A | 6/2012 |
| JP | 2013045246 A | 3/2013 |
| KR | 20120131874 A | 12/2012 |

* cited by examiner

TRANSPARENT CONDUCTIVE FILM AND PREPARATION METHOD THEREOF

FIELD OF THE INVENTION

The present disclosure relates to a field of conductive film, and more particularly relates to a transparent conductive film and a preparation method thereof.

BACKGROUND OF THE INVENTION

The transparent conductive film is a type of conductive film having good conductivity and high light transmittance in the visible wavelengths. Currently, the transparent conductive film has been widely used in fields of flat panel displays, photovoltaic devices, touch panels and electromagnetic shielding and others, the transparent conductive film has an extremely wide market space.

ITO has been dominated the market of the transparent conductive film. However, in most practical applications of the touch screen, the procedures of exposure, development, etching, and cleaning and others for patterning the transparent conductive film are needed, i.e. a fixed conductive area and insulating area are formed on the surface of the substrate according to the designed pattern. In contrast, a metal mesh is directly formed on the designated area of the substrate by printing, which has a lot of advantages, such as the process of patterning can be omitted, the pollution and cost is low and so on. The line of the mesh is made of metal with great conductivity, which is opaque, the line width is below the resolution for eye; the area without line is light transmission area. The surface square resistance and the light transmittance of the transparent conductive film can be controlled within a certain range by changing the line width and the shape of the mesh.

In the conductive film prepared by conventional printing, the densities of the mesh of the position sensor sensing area and the lead area are different, the cycle of the mesh of the sensing area is great, the density of the mesh is small, while the cycle of the mesh of the lead is small, the mesh is relatively intensive, such that the lead area is relatively adverse to impact the conductivity and adhesion during production.

SUMMARY OF THE INVENTION

The present disclosure is directed to provide a transparent conductive film and a method of manufacturing the transparent conductive film with greater conductivity and the adhesion.

According to an aspect of the present disclosure, a transparent conductive film is provided, which includes:
a transparent substrate; and
a polymer layer laminated on the transparent substrate; a surface of the polymer layer is patterned to define a meshed trench, the meshed trench is filled with a conductive material to form a sensing area, a periphery of the sensing area is printed with a lead, and the lead is electrically connected to the conductive material in the meshed trench.

In one embodiment, the sensing area is a visible area, a light transmittance of the sensing area is greater than 85%.

In one embodiment, the lead is formed by screen printing or ink-jet printing.

In one embodiment, the lead is a mesh or a straight line, and a width of the straight line ranges from 5 μm to 200 μm, a height of the straight line ranges from 5 μm to 10 μm, a width of the mesh ranges from 2 μm to 6 μm, a depth of the mesh ranges from 5 μm to 10 μm.

In one embodiment, the mesh formed by the trench is a regular mesh or random irregular mesh.

In one embodiment, the sensing area is provided with a straight line on an edge thereof electrically connected to the conductive material in the trench, the conductive material of the lead is electrically connected to the conductive material in the trench via the straight line; or the lead is a mesh line, and the lead is electrically connected to the conductive material in the trench via a node.

According to an aspect of the present disclosure, a transparent conductive film is provided, which includes:
a transparent substrate, the transparent substrate has a first surface and a second surface opposite to the first surface, both the first surface and the second surface are patterned to define a meshed trench, the meshed trench is filled with a conductive material to form a sensing area, a periphery of the sensing area is printed with a lead, and the lead is electrically connected to the conductive material in the meshed trench.

In one embodiment, the lead is formed by screen printing or ink-jet printing.

In one embodiment, the sensing area is provided with a straight line on an edge thereof electrically connected the conductive material in the trench, the conductive material of the lead is electrically connected to the conductive material in the trench via the straight line; or the lead is a mesh line, and the lead is electrically connected to the conductive material in the trench via a node.

According to an aspect of the present disclosure, a transparent conductive film is provided, which includes:
a transparent substrate and a polymer layer being deposited on the transparent substrate, a surface of the polymer layer is patterned to define a meshed first trench, the meshed first trench is filled with a conductive material to form a first sensing area, a periphery of the first sensing area is printed with a first lead, the first lead is electrically connected to the conductive material in the meshed first trench, the first sensing area and the first lead are provided with a polymer layer, a surface of the polymer layer is patterned to define a meshed second trench, the meshed second trench is filled with a conductive material to form a second sensing area, a periphery of the second sensing area is printed with a second lead, the second lead is electrically connected to the conductive material in the meshed second trench, the first sensing area and the second sensing area are insulated from each other.

In one embodiment, the first lead and the second lead are formed by screen printing or ink-jet printing.

In one embodiment, the first sensing area and second sensing area are respectively provided with a straight line on an edge thereof electrically connected the conductive material in the first trench and the second trench, the conductive material of the first lead and the second lead is electrically connected to the conductive material in the first trench and the second trench via the straight line; or the first lead and the second leas are mesh line, the first lead and the second lead are respectively electrically connected to the conductive material in the first trench and the second trench via a node.

According to an aspect of the present disclosure, a method of manufacturing a transparent conductive film is provided, which includes the following steps:
providing a transparent substrate having a first polymer layer, a surface of the first polymer layer being patterned to a meshed first trench;
filling a conductive material in the first trench to form a sensing area; and
printing a first lead on a periphery of the sensing area, and the lead being electrically connected to the conductive material in the first trench.

In one embodiment, the method of manufacturing a transparent conductive film further includes:

coating a second polymer layer on the first lead and the sensing area;

patterning a meshed second trench on the second polymer layer to form a meshed second trench;

filling a conductive material in the meshed second trench on the surface of the second polymer layer to form a sensing area; and printing a second lead on a periphery of the sensing area on the second polymer layer, and the second lead being electrically connected to the conductive material in the second trench, the sensing area on the second polymer layer and the sensing area on the first polymer layer are insulated from each other.

In the transparent conductive film and the method for manufacturing the transparent conductive film, a trench is filled with a conductive material to form a sensing area, and a lead is formed by printing and electrically connected to the conductive material in the trench, the lead has a relatively high yield.

DETAILED DESCRIPTION OF THE EMBODIMENTS

A sensing area and a lead are formed on a substrate by printing in one-time in the conventional technique, the main idea of the following embodiments of the transparent conductive film and the preparation method thereof is: firstly, a meshed trench is patterned on the substrate, and the trench is filled with a conductive material to form a sensing area, finally, a periphery of the sensing area is printed with a lead, the lead is electrically connected to the conductive material in the meshed trench. In this way, the defect of low yield of the lead by conventional printing technique due to the different between densities of the sensing area and the lead can be avoided, thereby the conductivity and adhesion of the lead is guaranteed.

The First Embodiment

Figure 1:
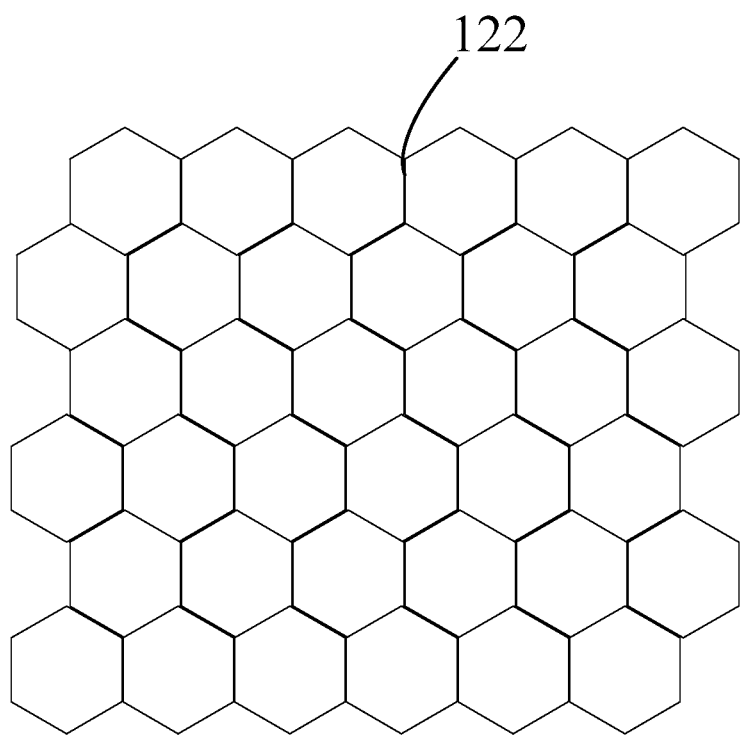
FIG. 1 is a schematic view of a transparent conductive film according to a first embodiment.
Figure 2:
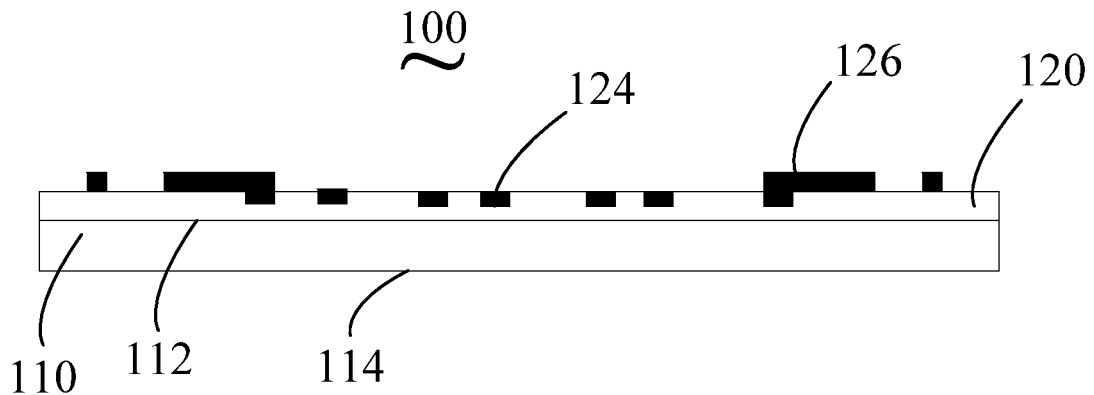
FIG. 2 is a schematic view of a meshed trench of the transparent conductive film according to the first embodiment.

Referring to FIG. 1 and FIG. 2, in the illustrated embodiment, a transparent conductive film 100 includes a substrate 110 and a first imprint adhesive layer (polymer layer) 120 laminated on the substrate 110.

The substrate 110 has a first surface 112 and a second surface 114 opposite to the first surface 112. The first imprint adhesive layer 120 is coated on the first surface 112. The first imprint adhesive layer is patterned to define form a meshed first trench 122. In other words, a plurality of meshes are formed by the first trench 122, the mesh line is the trench. The mesh can be a regular mesh, such as regular polygon, or random irregular mesh. The first trench 122 is filled with a conductive material 124, thereby the area where the first trench 122 located forms a first sensing area.

A periphery of the first sensing area on the first imprint adhesive layer 120 is printed with a first lead 126, the first lead 126 is electrically connected to the conductive material 124 in the first trench 122. The first lead 126 is a mesh or a straight line, and a width of the straight line ranges from 5 μm to 200 μm, a height of the straight line ranges from 5 μm to 10 μm, a width of the mesh ranges from 2 μm to 6 μm, a depth of the mesh ranges from 5 μm to 10 μm.

In the illustrated embodiment, the substrate 110 can be a transparent substrate made of transparent material, such as glass, or it can be any flexible transparent substrate suitable for the touch fields. The first sensing area is used for the user to touch and achieve induction. The first sensing area is a visible area, the area of the conductive material 124 is a conductive area, and the mesh formed by the first trench 122 is a light transmission area. The light transmittance of the first sensing area is related to the light transmittance of the substrate 110 and the area of the conductive area, in the illustrated embodiment, the light transmittance of the first sensing area is greater than 85%.

Figure 3:
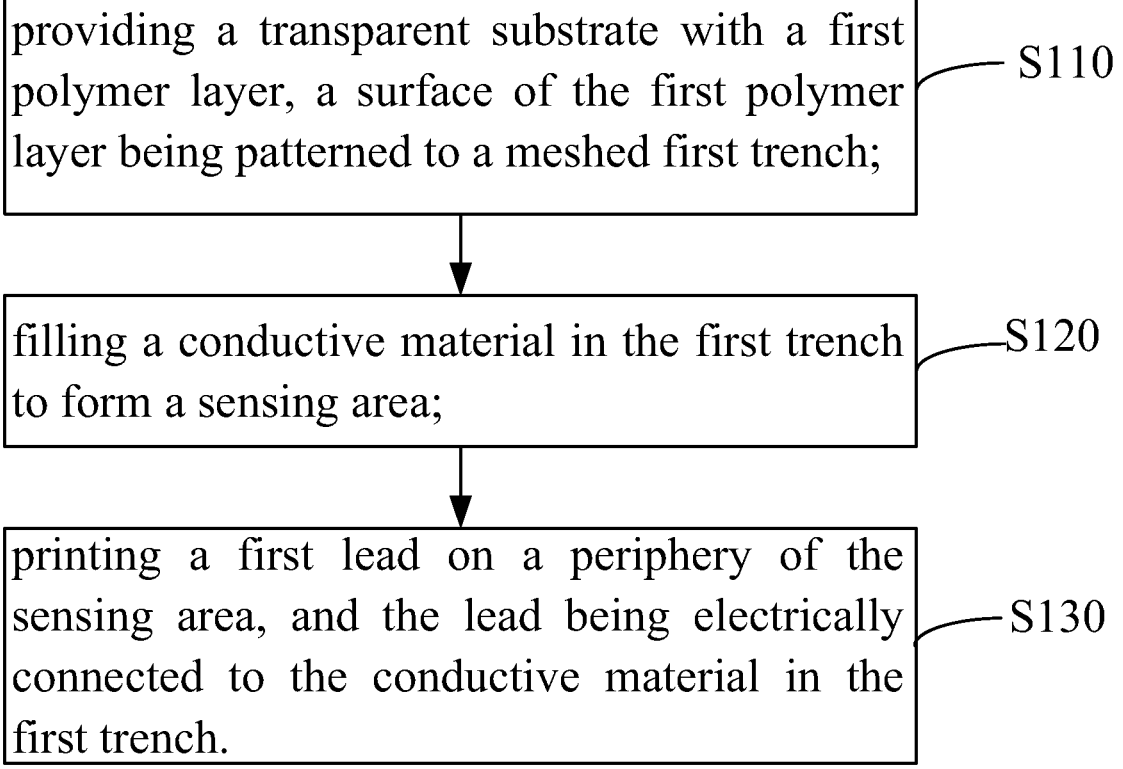
FIG. 3 is a flowchart of a method of manufacturing the transparent conductive according to the first embodiment.

Referring to FIG. 3, in the illustrated embodiment, a method of manufacturing the transparent conductive film 100 is shown as following:

1. the first surface 112 of the substrate 110 is coated with the first imprint adhesive layer 120. It can be formed by coating, spray coating with a UV (Ultraviolet Rays) adhesive.

2. the first imprint adhesive layer 120 is patterned to define the meshed trench 122. The first imprint adhesive layer 120 is patterned to define a meshed pattern by etching, the line of the mesh is the first trench 122.

3. the first trench 122 is filled with the conductive material 124 to form the first sensing area. For example, the conductive material 124 can be filled in the first trench 122 by coating, such as nano-silver ink; then sintered to form a conductive area in the first trench 122. It can also be formed by vacuum sputtering or chemical plating, the first imprint adhesive layer 120 is metallized to form the conductive area.

4. the periphery of the first sensing area is printed with the first lead 126, and the first lead is electrically connected to the conductive material 124 in the first trench 122. The first lead 126 is formed by screen printing or ink-jet printing, the yield is relatively high.

The Second Embodiment

Figure 4:
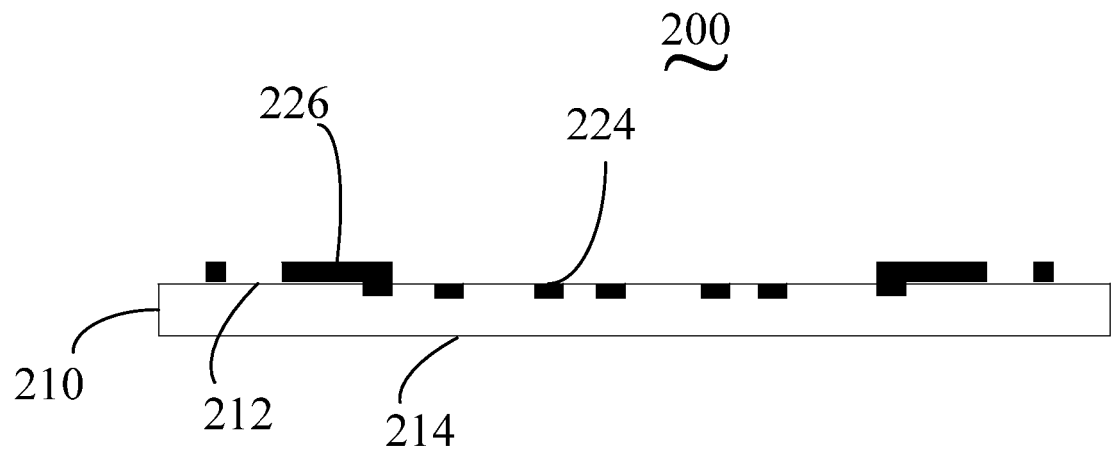
FIG. 4 is a schematic view of a transparent conductive film according to a second embodiment.
Figure 5:
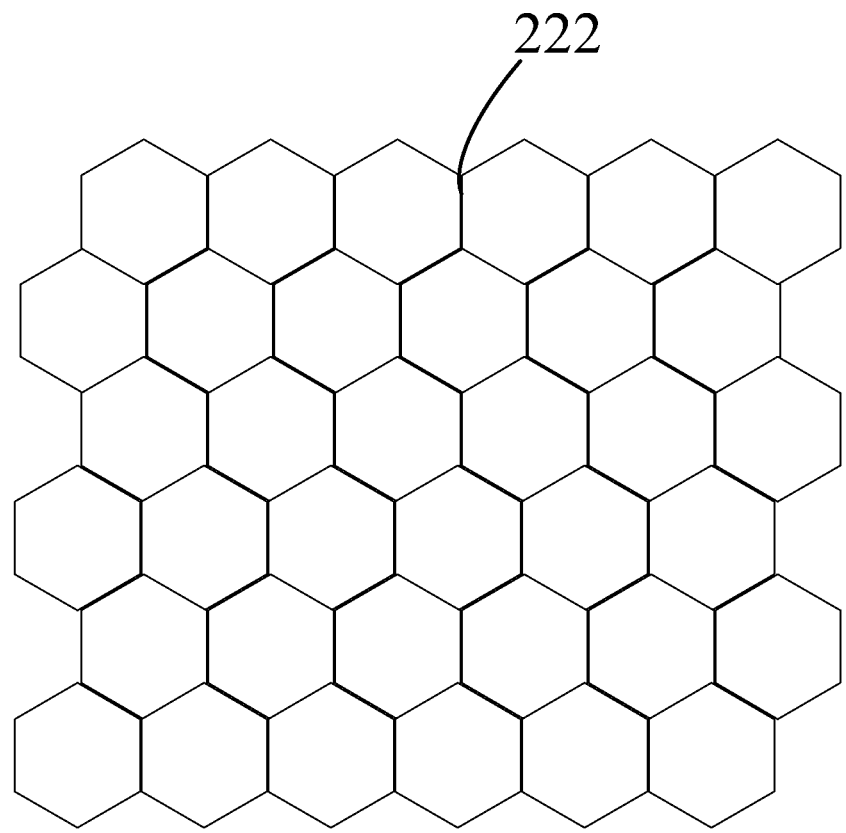
FIG. 5 a schematic view of a meshed trench of the transparent conductive film according to the second embodiment.
Figure 6:
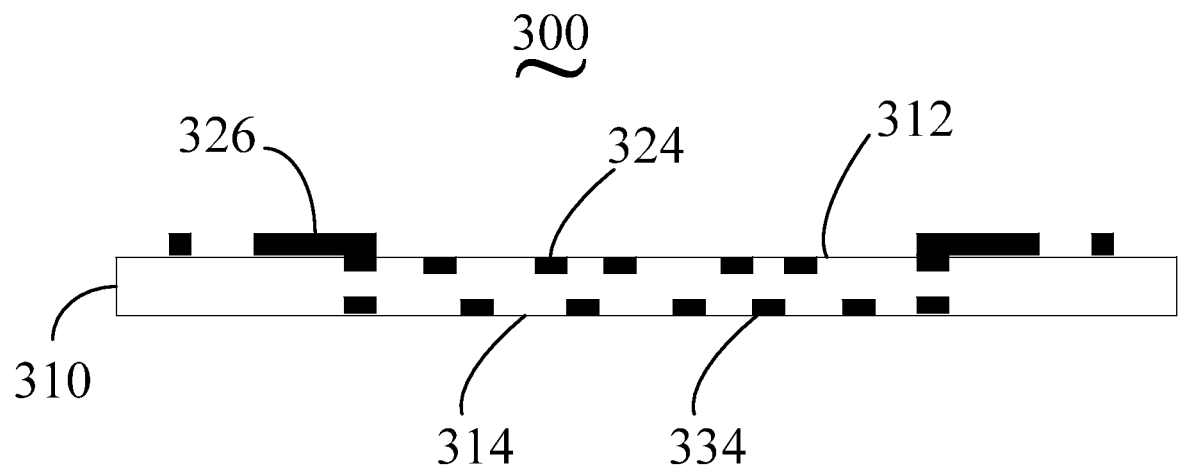
FIG. 6 and FIG. 7 are schematic view of a transparent conductive film according to a third embodiment.
Figure 7:
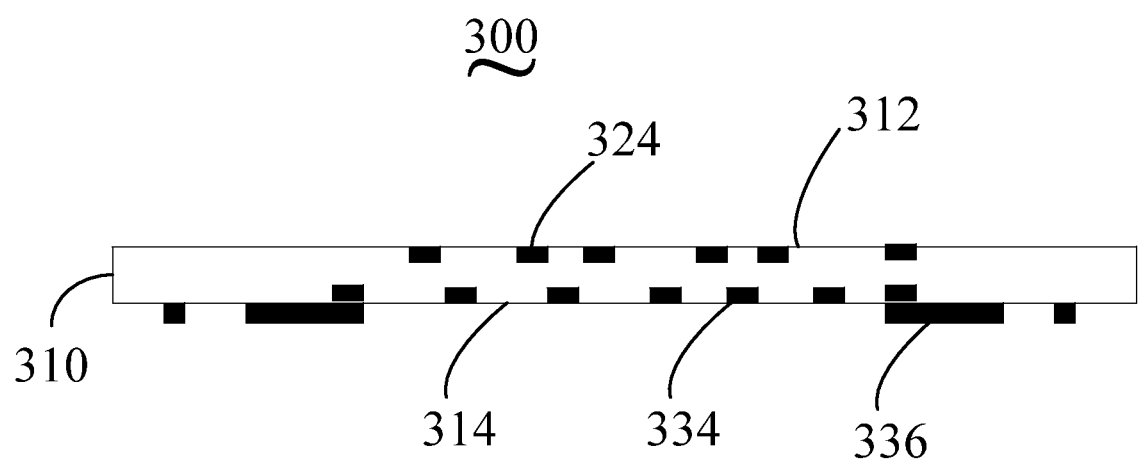
Figure 8:
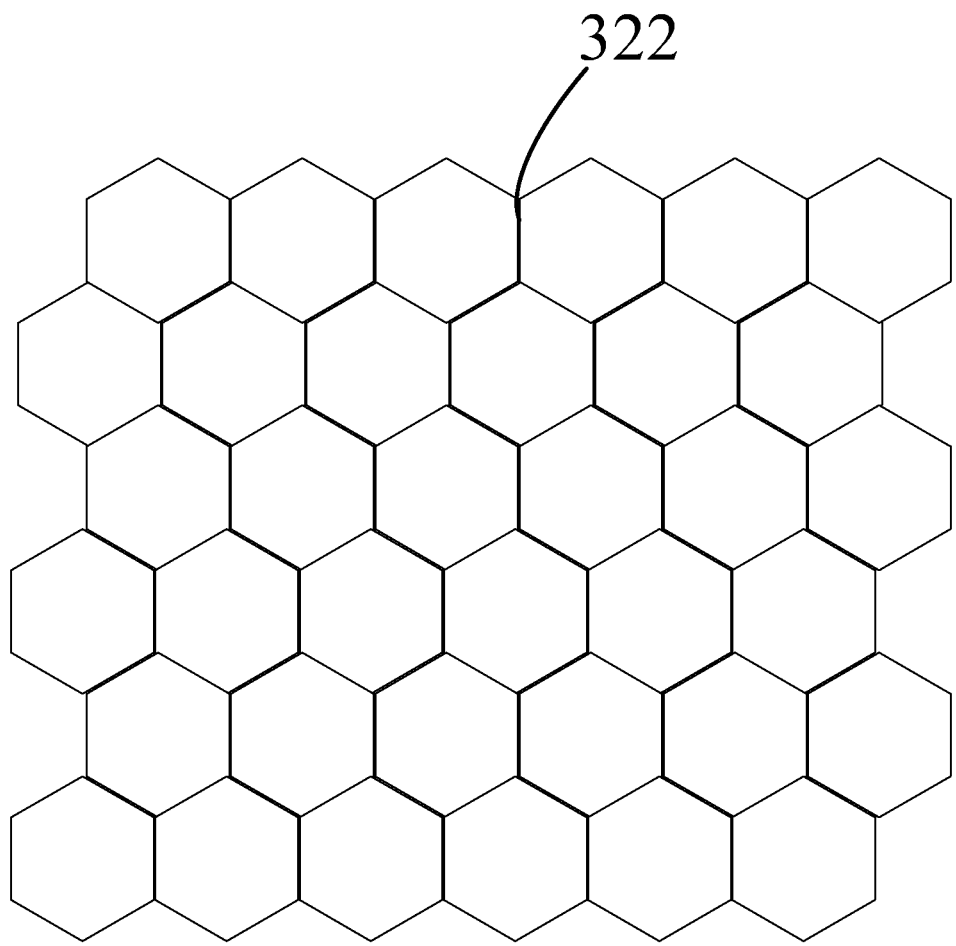
FIG. 8 is a schematic view of a meshed first trench of the transparent conductive film according to the third embodiment.
Figure 9:
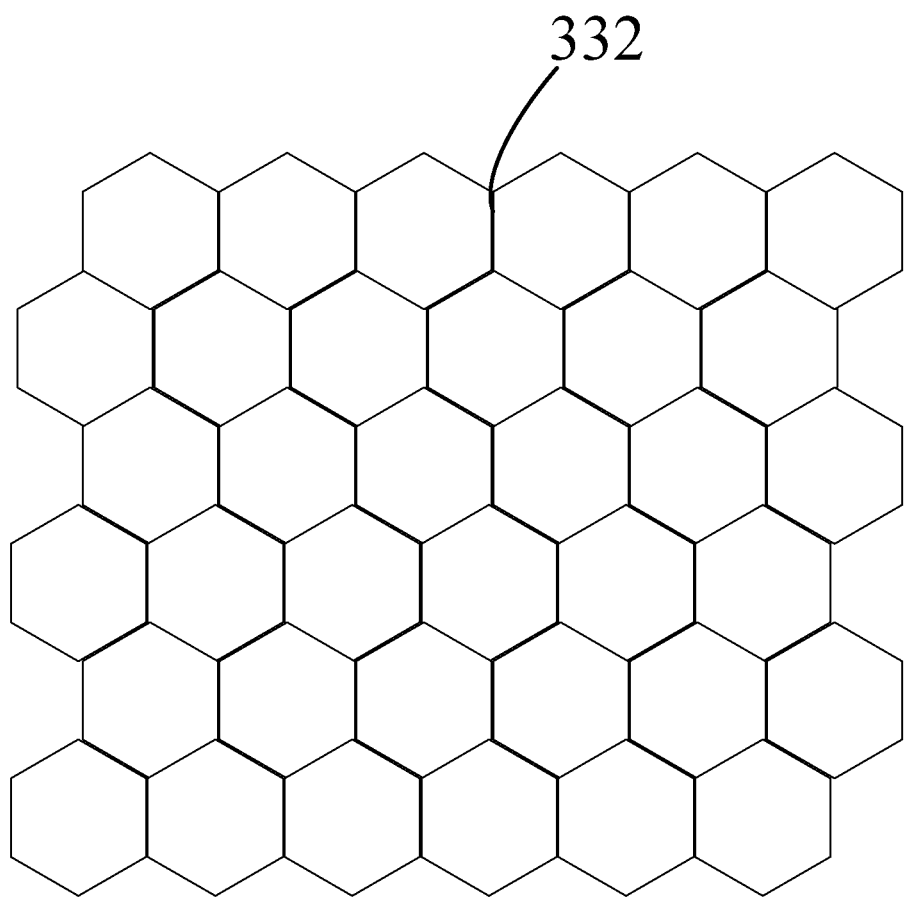
FIG. 9 is a schematic view of a meshed second trench of the transparent conductive film according to the third embodiment.
Figure 10:
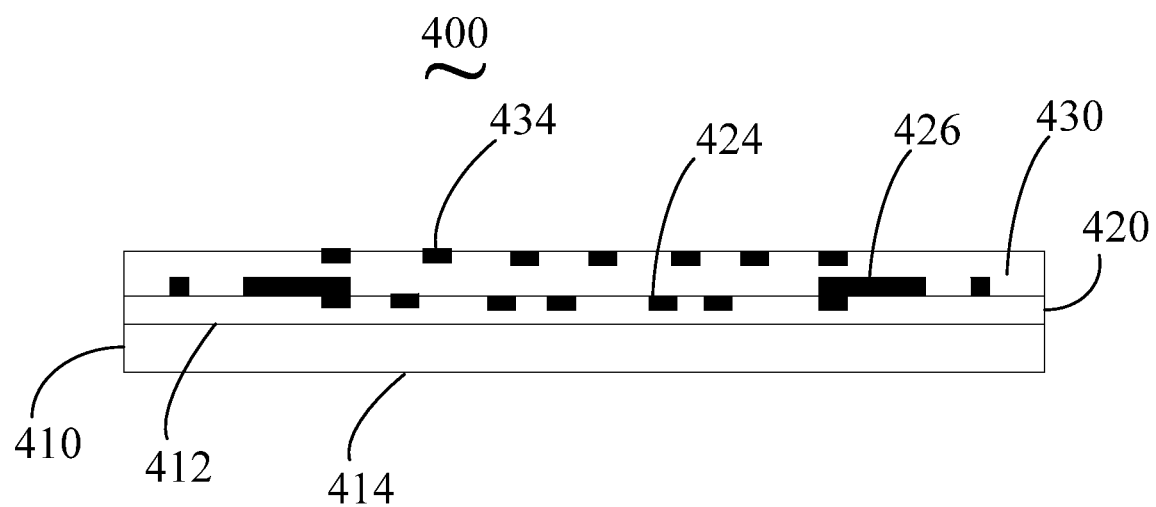
FIG. 10 and FIG. 11 are schematic view of a transparent conductive film according to a fourth embodiment.
Figure 11:
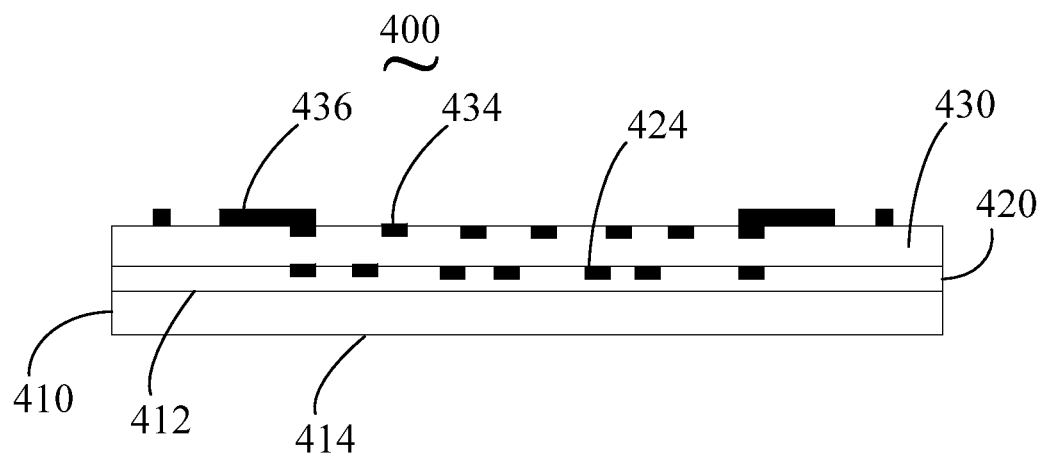
Figure 12:
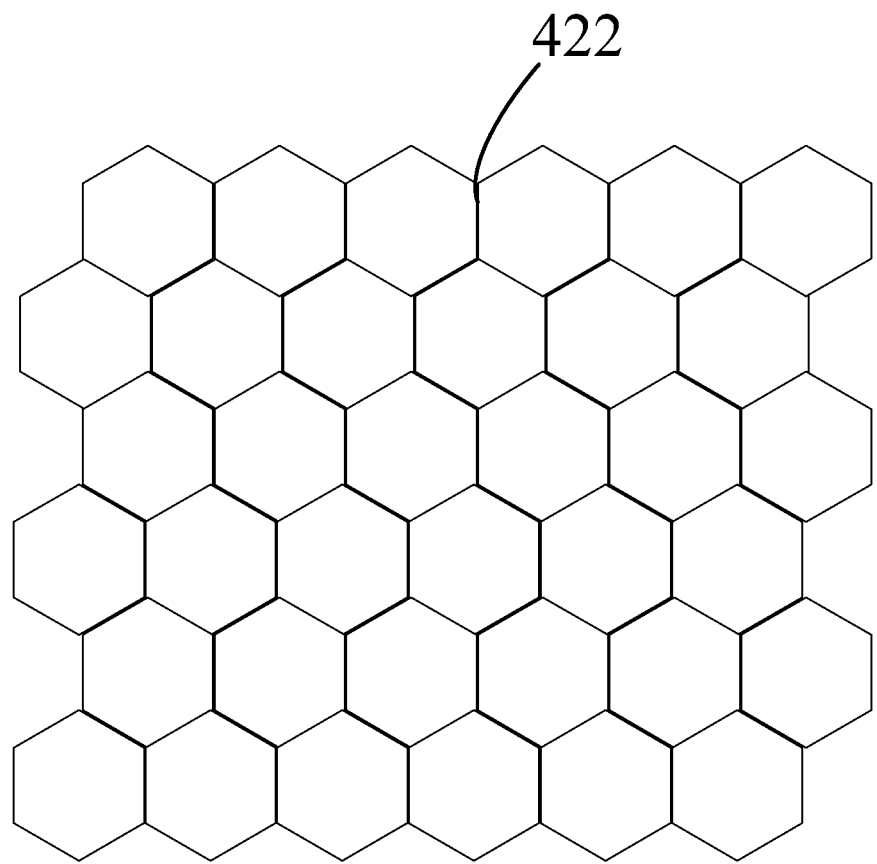
FIG. 12 is a schematic view of a meshed first trench of the transparent conductive film according to the fourth embodiment.
Figure 13:
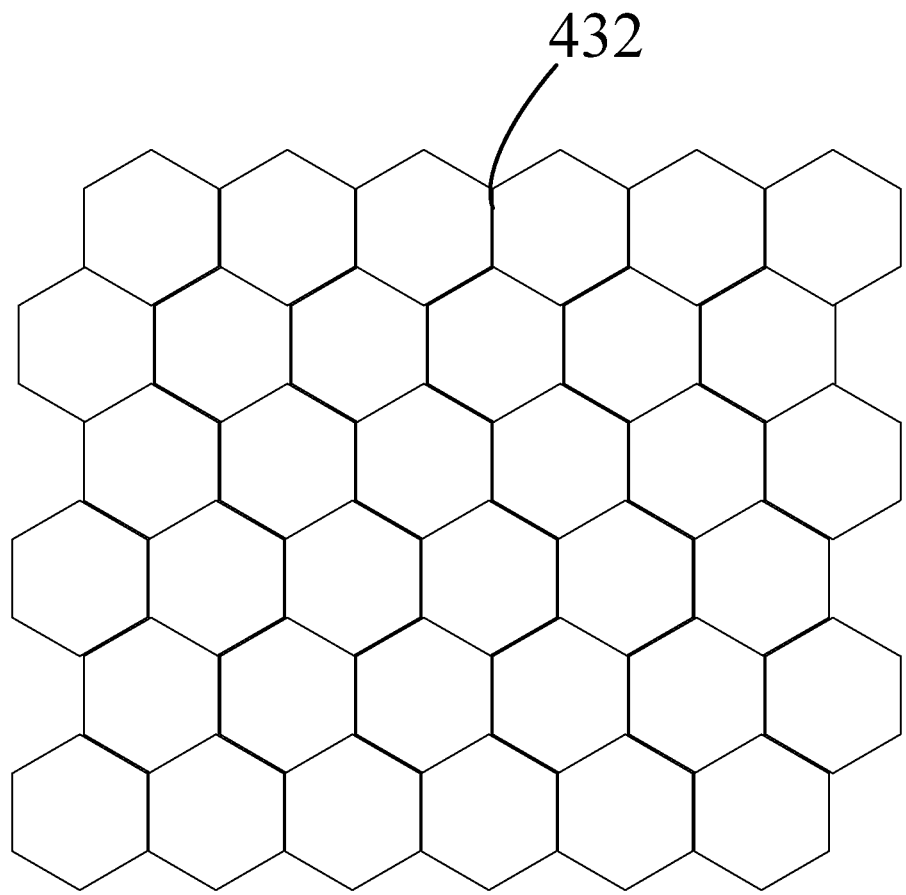
FIG. 13 is a schematic view of a meshed second trench of the transparent conductive film according to the fourth embodiment.

Referring to FIG. 4 and FIG. 5, a transparent conductive film 200 includes a transparent substrate 210. The substrate 210 has a first surface 212 and a second surface 214 opposite to the first surface 212. The first surface 212 is patterned to define a meshed first trench 222. In other words, a plurality of meshes are formed by the first trench 222, the mesh line is the trench. The mesh can be a regular mesh, such as regular polygon, or random irregular mesh. The first trench 222 is filled with a conductive material 224, thereby the area where the first trench 222 located forms a first sensing area. The same as the first embodiment, the first sensing area is a visible area, the light transmittance is greater than 85%, the area of the conductive material 224 is formed a conductive area, and the mesh formed by the first trench 222 is a light transmission area.

A periphery of the first sensing area on the first surface 212 is printed with a first lead 226, and the first lead 226 is electrically connected to the conductive material 224 in the first trench 222. The first lead 226 is a mesh or a straight line, and a width of the straight line ranges from 5 μm to 200 μm, a height of the straight line ranges from 5 μm to 10 μm, a width of the mesh ranges from 2 μm to 6 μm, a depth of the mesh ranges from 5 μm to 10 μm.

In the illustrated embodiment, a method of manufacturing the transparent conductive film 200 is shown as following:

1. the first surface 212 of the substrate 210 is patterned to define the meshed first trench 222. The first surface 212 is patterned to define a meshed pattern by etching and the like, the line of the mesh is the first trench 222.

2. the first trench 222 is filled with the conductive material 224 to form the first sensing area. For example, the conductive material 224 can be filled in the first trench 222 by coating, such as nano-silver ink, then sintered to form a conductive area in the first trench 222.

3. the periphery of the first sensing area is printed with the first lead 226, and the first lead 226 is electrically connected to the conductive material 224 in the first trench 222. The first lead 226 is formed by screen printing or ink-jet printing, the yield is relatively high. Accordingly, a single-side and single-layer conductive film is provided.

The Third Embodiment

Referring to FIG. 6 to FIG. 9, a transparent conductive film 300 includes a transparent substrate 310. The substrate 310 has a first surface 312 and a second surface 314 opposite to the first surface 312.

The first surface 312 is patterned to define a meshed first trench 322. In other words, a plurality of meshes are formed by the first trench 322, the mesh line is the trench. The mesh can be a regular mesh, such as regular polygon, or random irregular mesh. The first trench 322 is filled with a conductive material 324, thereby the area where the first trench 322 located forms a first sensing area. The same as the first embodiment, the first sensing area is a visible area, the light transmittance is greater than 85%, the area of the conductive material 324 is formed a conductive area, and the mesh formed by the first trench 322 is a light transmission area. A periphery of the first sensing area on the first surface 312 is printed with a first lead 326, and the first lead 326 is electrically connected to the conductive material 324 in the first trench 322.

The second surface 314 is patterned to define form a meshed second trench 332. In other words, a plurality of meshes are formed by the second trench 332, the mesh line is the trench. The mesh can be a regular mesh, such as regular polygon, or random irregular mesh. The second trench 332 is filled with a conductive material 334, thereby the area where the second trench 332 located forms a second sensing area. The same as the first embodiment, the second sensing area is a visible area, the light transmittance is greater than 85%, the area of the conductive material 334 is formed a conductive area, and the mesh formed by the second trench 332 is a light transmission area. A periphery of the second sensing area on the second surface 314 is printed with a second lead 336, and the second lead 336 is electrically connected to the conductive material 334 in the second trench 332. The first lead 326 and the second lead 336 are mesh or straight line, and a width of the straight line ranges from 5 μm to 200 μm, a height of the straight line ranges from 5 μm to 10 μm, a width of the mesh ranges from 2 μm to 6 μm, a depth of the mesh ranges from 5 μm to 10 μm.

In the illustrated embodiment, a method of manufacturing the transparent conductive film 300 is shown as following:

1. the first surface 312 of the substrate 310 is patterned to define the meshed first trench 322.

2. the first trench 322 is filled with the conductive material 324 to form the first sensing area.

3. the periphery of the first sensing area is printed with the first lead 326, and the first lead 326 is electrically connected to the conductive material 324 in the first trench 322. The first lead 326 is formed by screen printing or ink-jet printing, the yield is relatively high.

4. referring to the step above, the second trench 332 is formed on the second surface 314, the second trench 332 is filled with the conductive material 334, and the second lead 326 is printed. Accordingly, a double-side and single-layer conductive is provided.

The Fourth Embodiment

Referring to FIG. 10 to FIG. 13, a transparent conductive film 400 includes a transparent substrate 410, a first imprint adhesive layer 420 and a second imprint adhesive layer 430.

The substrate 410 has a first surface 412 and a second surface 414 opposite to the first surface 412. The first imprint adhesive layer 420 is laminated on the first surface 412. The first imprint adhesive layer 420 is patterned to define form a meshed first trench 422. In other words, a plurality of meshes are formed by the first trench 422, the mesh line is the trench. The mesh can be a regular mesh, such as regular polygon, or random irregular mesh. The first trench 422 is filled with a conductive material 424, thereby the area where the first trench 422 located forms a first sensing area. A periphery of the first sensing area on the first imprint adhesive layer 420 is printed with a first lead 426, and the first lead 426 is electrically connected to the conductive material 424 in the first trench 422.

The second imprint adhesive layer 430 is laminated on the first imprint adhesive layer 420, the second imprint adhesive layer 430 is patterned to define form a meshed second trench 432. In other words, a plurality of meshes are formed by the second trench 432, the meshed line is the trench. The mesh can be a regular mesh, such as regular polygon, or random irregular mesh. The second trench 432 is filled with a conductive material 434 to form a second sensing area. A periphery of the second sensing area on the second imprint adhesive layer 430 is printed with a second lead 436, and the second lead 436 is electrically connected to the conductive material 434 in the second trench 432. Furthermore, the second sensing area and the first sensing area are insulated from each other. Accordingly, a single-side double-layer conductive film is formed, which can achieve single conductive film supporting multi-touch when applied to the touch field, and a thickness of the touch is low.

In the illustrated embodiment, both the light transmittance of the first sensing area and the second sensing area are greater than 85%. Both the first lead 426 and the second lead 436 are mesh or straight line, and a width of the straight line ranges from 5 μm to 200 μm, a height of the straight line ranges from 5 μm to 10 μm, a width of the mesh ranges from 2 μm to 6 μm, a depth of the mesh ranges from 5 μm to 10 μm.

In the illustrated embodiment, a method of manufacturing the transparent conductive film 400 of is shown as following:

1. the first surface 412 of the substrate 410 is coated with the first imprint adhesive layer 420.
2. the first imprint adhesive layer 420 is patterned to define the first trench 422.
3. the first trench 422 is filled with the conductive material 424 to form the first sensing area.
4. the periphery of the first sensing area is printed with the first lead 426, and the first lead 426 is electrically connected to the conductive material 424 in the first trench 422. The first lead 426 is formed by screen printing or ink-jet printing, the yield is high.
5. the first imprint adhesive layer 420 is coated with the second imprint adhesive layer 430.
6. the second imprint adhesive layer 430 is patterned to define the second trench 432.
7. the second trench 432 is filled with a conductive material 434 to form the second sensing area.
8. the periphery of the second sensing area is printed with the second lead 436, and the second lead 436 is electrically connected to the conductive material 434 in the second trench 432. The second lead 436 is formed by screen printing or ink-jet printing, the yield is high.

In the transparent conductive film and the method of manufacturing the transparent conductive film of the embodiments, the sensing area and the lead are not formed by one time printing, it is no need to consider the density of the sensing area when the lead is printed, the yield is relatively high.

The electrical connection of the sensing area and lead are described combined with an illustrative embodiment.

Figure 14:
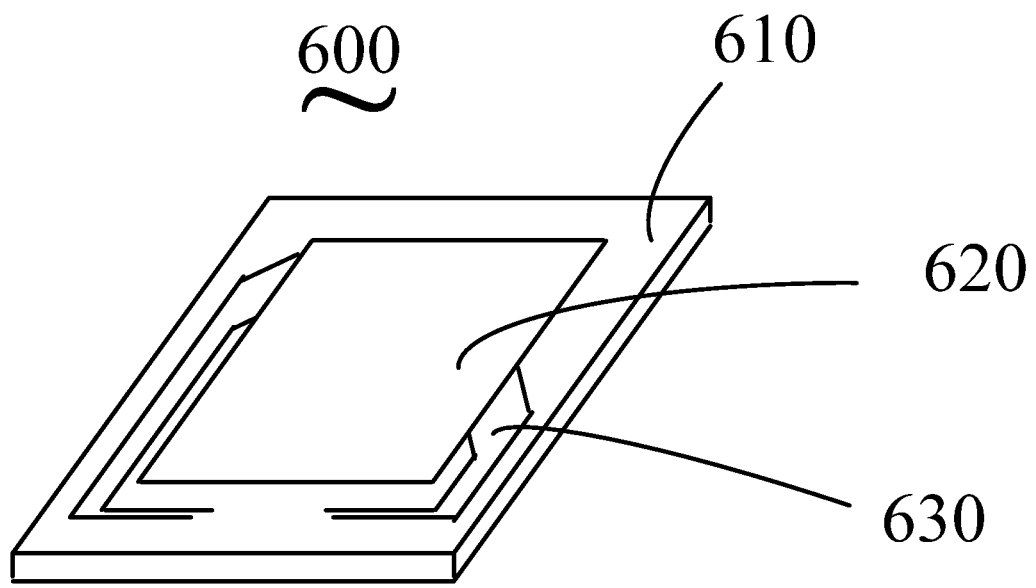
FIG. 14 and FIG. 15 are perspective view of a transparent conductive film according to an embodiment.
Figure 15:
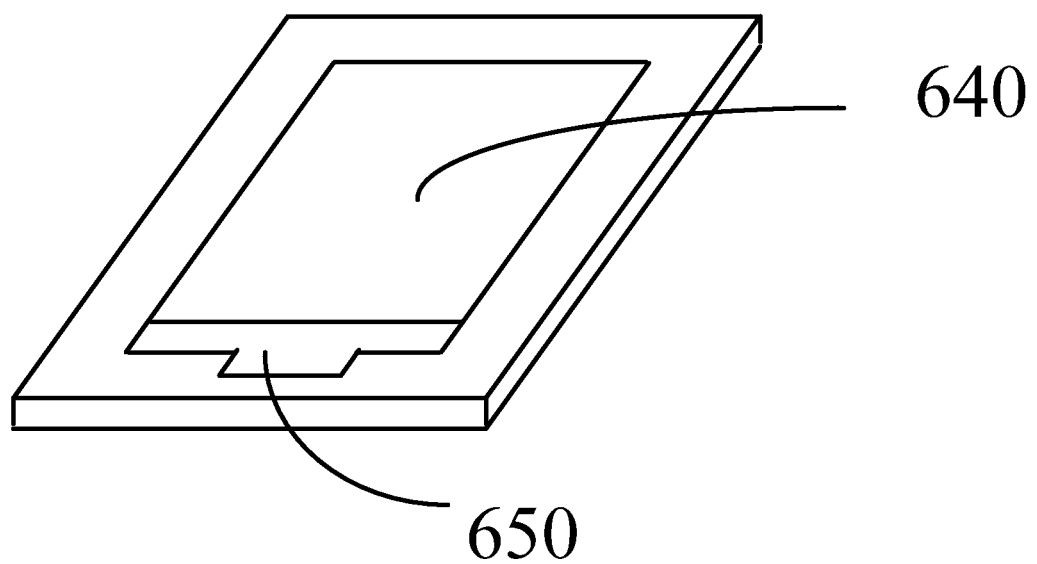

Referring to FIG. 14 and FIG. 15, in the illustrated embodiment, a transparent conductive film 600 includes a substrate 610. A first sensing area 620 and a first lead 630 electrically connected to the first sensing area 620, and a second sensing area 640 and a second lead 650 electrically connected to the second sensing area 640 are respectively formed on the two opposite surfaces of the substrate 610. The transparent conductive film 600 is a double-side single-layer conductive film. It can be seen from the first embodiment to the fourth embodiment that, the transparent conductive film 600 can be provided with a polymer layer, and the first, second sensing area, and the first, second lead can be laminated on the polymer layer.

Figure 16:
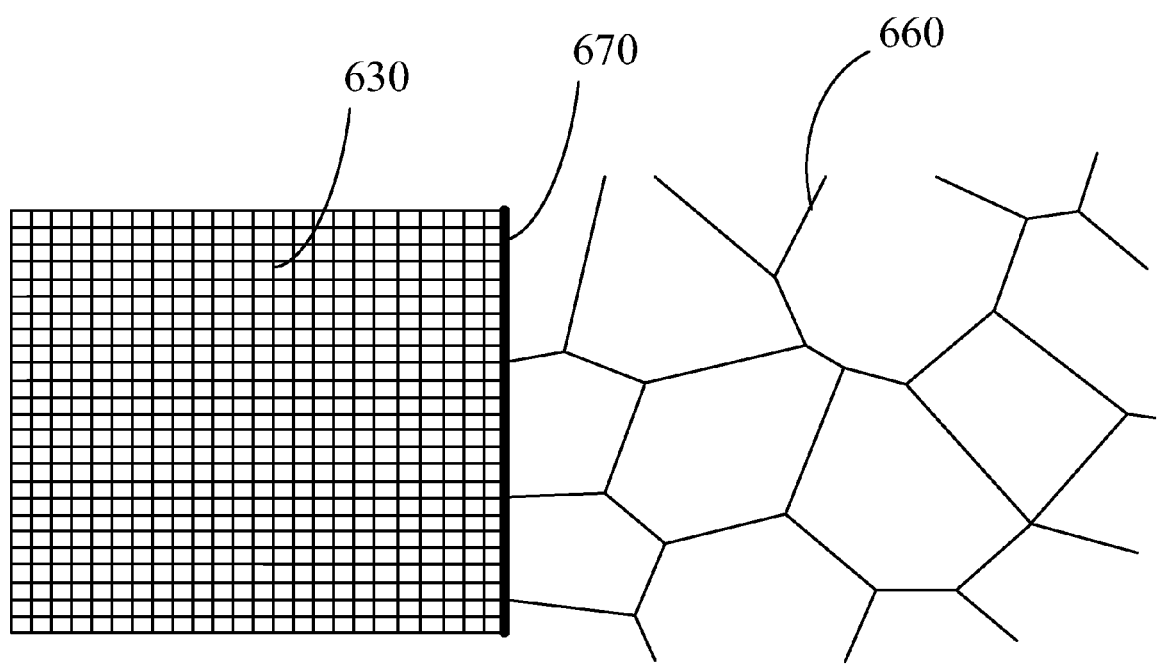
FIG. 16 is a schematic view of a electrical connection of sensing area and a lead of a transparent conductive film according to an embodiment.

Referring to FIG. 16, take the first sensing area 620 and the first lead 630 as an example. The first sensing area 620 is formed by filling conductive material in the first trench 660, the first trench 660 is the lines of the mesh of the first sensing area. The electrical connection is: a periphery of the first sensing area 620 is provided with a straight line 670 containing conductive material. The straight line 670 is electrically connected to the conductive material in the first trench 660. The straight line 670 can be formed by the following way: a linear trench is formed on the edge of the first sensing area 620 when the first trench is formed by patterning, and then filled with conductive material.

Figure 17:
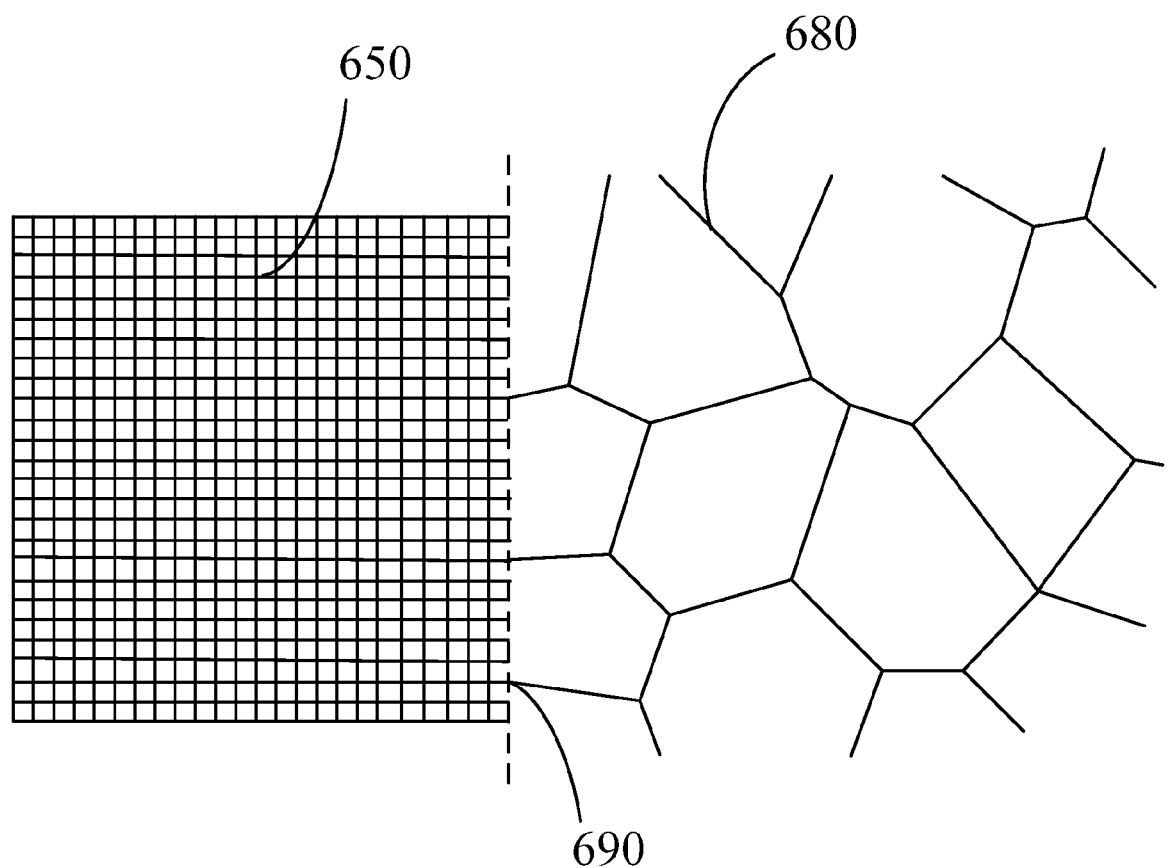
FIG. 17 is a schematic view of a electrical connection of sensing area and a lead of a transparent conductive film according to another embodiment.

Referring to FIG. 17, take the second sensing area 640 and the second lead 650 as an example. The second sensing area 620 is formed by filling conductive material in the second trench 680, the second trench 680 is the lines of the mesh of the first sensing area. The second sensing area 650 is printed to a meshed-like with the lines of the mesh. The electrical connection is: the lines of the mesh of the second lead 650 is connected to the lines of the mesh of the second sensing area 640 via a node 690, a plurality of nodes 690 can be deposited.

It should be understood that the descriptions of the examples are specific and detailed, but those descriptions can't be used to limit the present disclosure. Therefore, the scope of protective of the disclosure patent should be subject to the appended claims.

What is claimed is:

1. A transparent conductive film comprising: a transparent substrate; and a polymer layer laminated on the transparent substrate; wherein a surface of the polymer layer is patterned to define a meshed trench, the meshed trench is filled with a conductive material to form a sensing area, a periphery of the sensing area is printed with a lead, and the lead is electrically connected to the conductive material in the meshed trench, wherein the lead is a mesh or a straight line, and a width of the straight line ranges from 5 .mu.m to 200 .mu.m, a height of the straight line ranges from 5 .mu.m to 10 .mu.m, a width of the mesh ranges from 2 .mu.m to 6 .mu.m, a depth of the mesh ranges from 5 .mu.m to 10 .mu.m.

2. The transparent conductive film according to claim 1, wherein the sensing area is a visible area, a light transmittance of the sensing area is greater than 85%.

3. The transparent conductive film according to claim 1, wherein the lead is formed by screen printing or ink-jet printing.

4. The transparent conductive film according to claim 1, wherein the mesh formed by the trench is a regular mesh or random irregular mesh.

5. The transparent conductive film according to claim 1, wherein the sensing area is provided with a straight line on an edge thereof electrically connected to the conductive material in the trench, the conductive material of the lead is electrically connected to the conductive material in the trench via the straight line; or the lead is a mesh line, and the lead is electrically connected to the conductive material in the trench via a node.

6. A transparent conductive film, comprising a transparent substrate, wherein the transparent substrate has a first surface and a second surface opposite to the first surface, both the first surface and the second surface are patterned to define a meshed trench, the meshed trench is filled with a conductive material to form a sensing area, a periphery of the sensing area is printed with a lead, and the lead is electrically connected to the conductive material in the meshed trench, wherein the sensing area is provided with a straight line on an edge thereof electrically connected to the conductive material in the trench, the conductive material of the lead is electrically connected to the conductive material in the trench via the straight line; or the lead is a mesh line, and the lead is electrically connected to the conductive material in the trench via a node.

7. The transparent conductive film according to claim 6, wherein the lead is formed by screen printing or ink-jet printing.

8. A transparent conductive film, comprising a transparent substrate and a polymer layer being deposited on the transparent substrate, wherein a surface of the polymer layer is patterned to define a meshed first trench, the meshed first trench is filled with a conductive material to form a first sensing area, a periphery of the first sensing area is printed with a first lead, the first lead is electrically connected to the conductive material in the meshed first trench, the first sensing area and the first lead are provided with a polymer layer, a surface of the polymer layer is patterned to define a meshed second trench, the meshed second trench is filled with a conductive material to form a second sensing area, a periphery of the second sensing area is printed with a second lead, the second lead is electrically connected to the conductive material in the meshed second trench, the first sensing area and the second sensing area are insulated from each other.

9. The transparent conductive film according to claim 8, wherein the first lead and the second lead are formed by screen printing or ink-jet printing.

10. The transparent conductive film according to claim 8, wherein the first sensing area and second sensing area are respectively provided with a straight line on an edge thereof electrically connected the conductive material in the first trench and the second trench, the conductive material of the first lead and the second lead is electrically connected to the conductive material in the first trench and the second trench via the straight line; or the first lead and the second leas are mesh line, the first lead and the second lead are respectively electrically connected to the conductive material in the first trench and the second trench via a node.

* * * * *